(12) United States Patent
Wang et al.

(10) Patent No.: US 6,647,625 B2
(45) Date of Patent: Nov. 18, 2003

(54) METHOD FOR FABRICATING A HEAT PIPE STRUCTURE IN A RADIATING PLATE

(76) Inventors: Wei Te Wang, 4F, No. 22, Lane 20, Chuan Chou St., Lin 11, Yung Kung Li, Chung Cheng Dist., Taipei (TW); Hung-Bin Chan, 3F, No. 8, Alley 4, Lane 185, Sec. 6, Chung Hsiao E. Rd., Lin 10, Hsing Cheng Li, Nan Kang Dist., Taipei (TW)

(*) Notice: Subject to any disclaimer, the term of this patent is extended or adjusted under 35 U.S.C. 154(b) by 29 days.

(21) Appl. No.: 10/013,361

(22) Filed: Dec. 13, 2001

(65) Prior Publication Data

US 2003/0110631 A1 Jun. 19, 2003

(51) Int. Cl.[7] .............................................. B23P 15/26
(52) U.S. Cl. ................................................ 29/890.032
(58) Field of Search ........................ 29/890.032, 890.03; 165/104.19, 104.21, 104.26, 104.27, 104.33; 361/687, 688, 699, 700; 257/712, 715

(56) References Cited

U.S. PATENT DOCUMENTS

| | | | |
|---|---|---|---|
| 4,880,052 A | * 11/1989 | Meyer et al. | 165/104.14 |
| 5,737,840 A | * 4/1998 | Akachi | 29/890.032 |
| 2001/0047590 A1 | * 12/2001 | McCullough | 29/890.032 |

* cited by examiner

Primary Examiner—I Cuda-Rosenbaum

(57) ABSTRACT

A method for fabricating a heat pipe structure in a radiating plate is provided. A tunneling means is used to form a plurality of radiating channels in the radiating plate. Each of the plurality of radiating channels has only one opening. Then, only one of the openings of the radiating channels is left unsealed, while sealing the other openings of the radiating channels. Working fluid is injected into the radiating channels via the unsealed opening. The radiating channels are vacuated and the unsealed opening is sealed.

11 Claims, 6 Drawing Sheets

METHOD FOR FABRICATING A HEAT PIPE STRUCTURE IN A RADIATING PLATE

BACKGROUND OF THE INVENTION

1. Field of the Invention

The present invention relates to the field of a method for fabricating a heat pipe structure in a radiating plate, and more particularly, to a method for fabricating a monolithic heat transfer device having a heat pipe structure integrally formed within the heat transfer device. The heat transfer device in accordance with the present invention is monolithic and seamless, thus achieving low heat resistance and high heat transfer efficiency. The heat pipes are arranged in an orthogonal matrix manner.

2. Description of the Prior Art

Various heat pipe techniques have been applied on heat transfer devices for efficiently transferring heat generated from a heat source such as an integrated circuit. FIG. 1 shows a perspective view of a typical heat transfer device with a heat pipe. As shown in FIG. 1, the prior art heat transfer device generally includes an aluminum pad 7, a radiator 1 attached to the aluminum pad 7, and a plate 6 laterally fixed on the aluminum pad 7 and located near the radiator 1. The radiator 1 has a plurality radiating fins 11. An adapting slot 12 is formed at a bottom portion of the radiator 1 for adapting a heat pipe 3. An askew groove 61 is formed in the plate 6. One end of the heat pipe 3 is inserted into the adapting slot 12 and the other end of the heat pipe 3 is fittingly wedged into the groove 61 in a slightly bent manner. In this way, heat is transferred from the plate 6 to the radiator 1 that is located near a fan (not shown) when in use. Solder paste 62 is used to fill gaps between the heat pipe 3 and the groove 61. FIG. 1A is a cross sectional view of heat pipe of FIG. 1. On interior surface of the heat pipe 3 there is provided a capillary structure 31. Working fluid 32 is enclosed in the heat pipe 3. Likewise, thermal grease 33 is used to fill gaps between the heat pipe 3 and the adapting slot 12.

However, the prior art heat transfer device of FIG. 1 encounters following problems:

1. It is troublesome for a manufacturer to form the adapting slot 12 of the radiator 1, and then insert the heat pipe 3 into the slot 12;
2. Heat conductive efficiency is affected since gaps may be formed, more or less, between the heat pipe 3 and the plate 6;
3. Quality of the heat pipe 3 is hardly controlled;
4. Since the heat pipe 3 is mounted on the aluminum pad 7 in a bent manner, portions of the capillary structure 31 may be damaged;
5. The aluminum pad 7 are formed from aluminum, heat pipe 3 are formed from copper and the solder paste 33 are formed from tin Aluminum,copper,and tinare different materials so heat conductive efficiency is thus reduced;
6. Although the gap between the heat pipe 3 and the plate 6 and the gap between the heat pipe 3 and the radiator 1 are both filled with thermal grease 33 and solder paste 62, rifts due to thermal expansion effect may be formed therein after long term use, thereby reducing the lifetime of the heat transfer device;
7. The prior art heat pipe 3 is subject to stresses that lead to cracking problems. In such case, the heat transfer device losses its heat transferring ability; and
8. Additional heat pipes are costly.

FIG. 2 is a cross sectional view showing another prior art heat transfer device utilizing a plate-type container. As shown in FIG. 2, the heat transfer device comprises a radiator 1 and a plate-type container 2 consisting of a top plate 21 and a bottom plate 22. The radiator 1 with a plurality of fins 11 is mounted onto the plate-type container 2 by means of solder paste 212. The bottom plate 22 is in contact with an object 4 to be cooled. The top plate 21 is combined with the bottom plate 22 to form a sealed space. A plurality of protuberances 211 are formed on a bottom surface of the top plate 21. Acapillary structure 221 is provided in the sealed space between the top plate 21 and the bottom plate 22. The sealed space is vacated and then injected with a working fluid (not shown).

Nevertheless, such configuration suffers from disadvantages such as high heat resistance between the radiator 1 and the plate-type container 2. Since the radiator 1 is mounted onto the plate-type container 2 by means of soldering, heat transfer efficiency is thus reduced. Further, the top plate 21, the bottom plate 22 and the protuberances 211 may be distorted or damaged when vacuating the sealed space defined by the top plate 21 and the bottom plate 22. The distortion of the bottom plate 22 may cause discontinuous and incomplete contact with the object 4 to be cooled.

From above, the disadvantages concerning the above-mentioned prior heat transfer devices may be summarized as follows:

1. The prior heat transfer devices are subject to distortion or cracking caused by negligent collision that leads to vacuum break of either the heat pipe or the plate-type container. In such case, the object to be cooled such as a CPU(central processing unit) may be burned out due to malfunction of the heat transfer device;
2. The prior heat transfer devices as depicted in FIG. 1 and FIG. 2 are complicated;
3. An optimal orthogonal arrangement of heat pipe cannot be achieved by the prior configuration as depicted in FIG. 1, since another heat pipe is required in a direction vertical to the heat pipe 3. Also, although the optimal orthogonal arrangement may be achieved by the prior structure depicted in FIG. 2, the protuberances 211 still suffer from distortion; and
4. The solder paste 62, thermal grease 33 and solder paste 212 are required in both prior heat transfer devices. However, the optimal coating thickness of the solder paste or thermal paste is hard to control. Besides, the solder paste or thermal paste may lead to cracking problem and seams or rifts may be observed after long-term use.

Consequently, there is a strong need to provide a heat transfer device and its fabrication method to solve the above-mentioned problems. The fabrication method according to this invention is simplified and suitable for industrial mass production.

SUMMARY OF THE INVENTION

It is a primary object of the present invention to provide a method for fabricating a heat pipe structure in a radiating plate. The heat transfer device in accordance with the present invention is monolithic and seamless, thus achieving low heat resistance and high heat transfer efficiency. The heat pipes are arranged in an orthogonal matrix manner. By virtue of the monolithic structure of the heat transfer device of this invention, structure strength is significantly improved and thus a substantially complete contact between an object to be cooled and the heat transfer device may be achieved. Heat generated from a heat source is transferred without passing through different medium of materials or any solder paste within the heat transfer device.

It is another object of the present invention to provide a method for fabricating a heat transfer device having advantages such as high yield, low weight, thin, and short fabrication time.

It is still another object of the present invention to provide a heat transfer device with a plurality of radiating fins and integral heat pipe structure to improve heat transfer efficiency.

It is still another object of the present invention to provide a method for fabricating a heat transfer device suitable for mounting on various heat transferring systems or heat dissipating modules.

According to the claimed invention, a method for fabricating a heat pipe structure in a radiating plate is provided. A tunneling means is used to form a plurality of radiating channels in the radiating plate. Each of the plurality of radiating channels has only opening. Then, only one of the openings of the radiating channels is not sealed, while sealing the other openings of the radiating channels. Working fluid is injected into the radiating channels via the reserved opening. Radiating channels is evacuated and the reserved opening is sealed.

It is to be understood that both the forgoing general description and the following detailed description are exemplary, and are intended to provide further explanation of the invention as claimed. Other advantages and features of the invention will be apparent from the following description, drawings and claims.

DETAILED DESCRIPTION OF THE PREFERRED EMBODIMENTS

Figure 3:
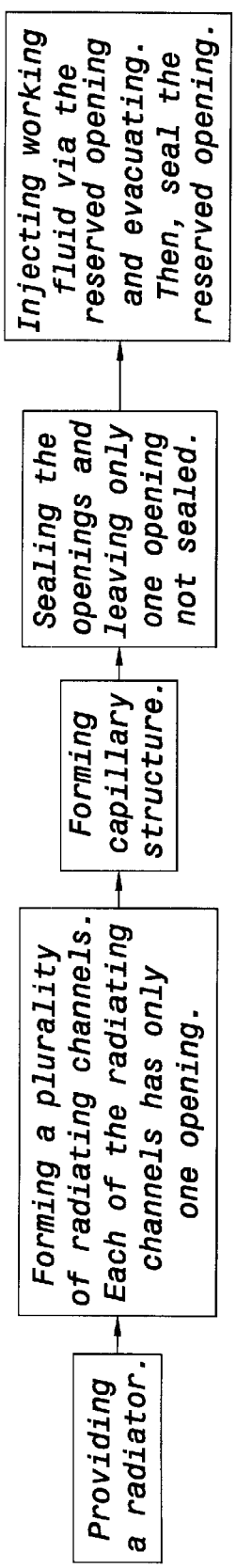
FIG. 3 is a flow chart of the preferred embodiment according to the present invention.
Figure 4:
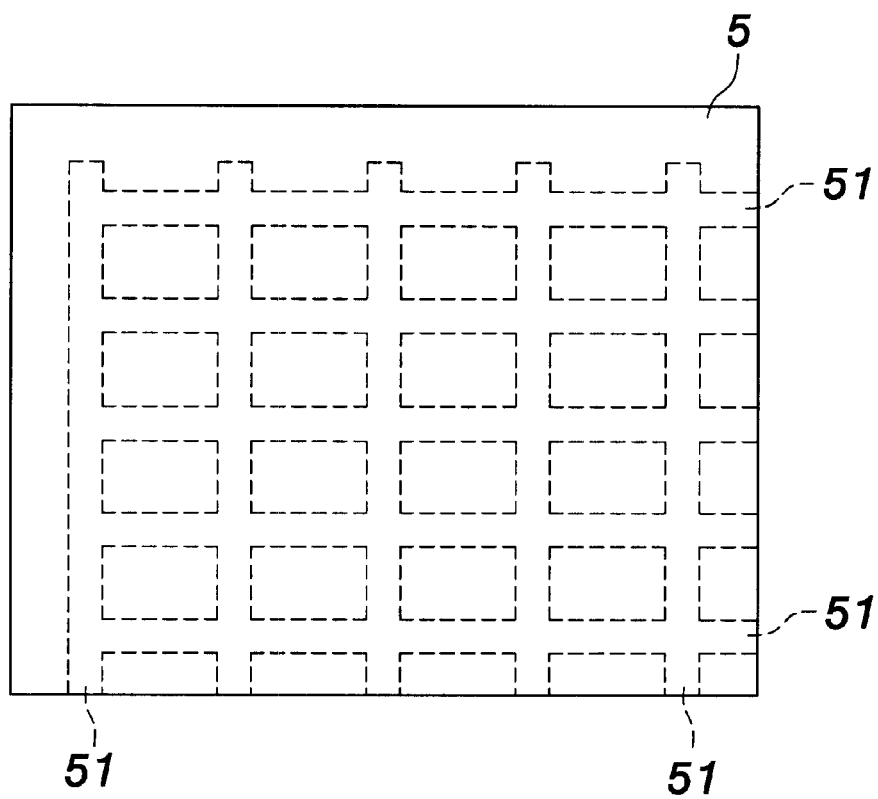
FIG. 4 is a top view of a heat transfer device of this invention.
Figure 5:
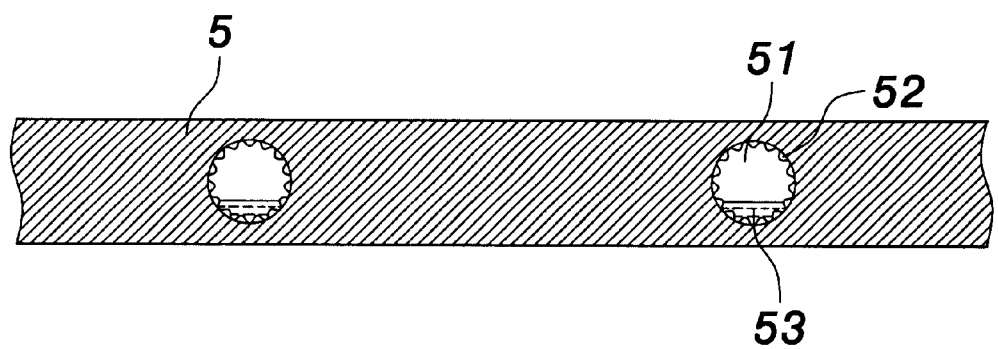
FIG. 5 is a fragmentary, cross-sectional view of the heat transfer device shown in FIG. 4.

Please refer to FIG. 3 to FIG. 5. FIG. 3 is a flow chart of the preferred embodiment according to the present invention, FIG. 4 is a top view of a heat transfer device of this invention, and FIG. 5 is a fragmentary, cross-sectional view of the heat transfer device shown in FIG. 4. The fabrication method for making a heat transfer device according to this invention generally comprises the following steps:

Step 1: providing a radiating plate 5 having a shape and size according to desired purposes.

Step 2: implementing a tunneling means to tunnel the radiating plate 5 so as to form a plurality of radiating channels 51. The radiating channels 51 are connected to each other to form a network and each of the radiating channels 51 has only one opening. The tunneling means may be, but not limited to, a drilling process, electrical discharge machining (EDM), or water-jet machining. Note that when drilling the radiating plate 5 to form the radiating channel 51, the channels should not be punch through.

Step 3: Leaving only one of the openings of the radiating channels 51 not sealed, while sealing the other openings of the radiating channels 51. To ensure a hermetical sealing of the radiating channels 51, a soldering technique or diffusion welding technique may be used. After sealing the openings of the radiating channels 51, a matrix of radiating channels is complete.

Step 4: injecting working fluid into the matrix of radiating channels via the reserved opening as mentioned and vacuating the radiating channels. After achieving a desired vacuum state, the reserved opening is sealed. Referring to FIG. 4 and FIG. 5, since the radiating channels 51 are connected, only one evacuating step and only one working fluid 53 filling process are taken. Further, the vacuating step and the working fluid 53 filling process may be implemented simultaneously.

The radiating channels 51 arranged in a matrix manner function and integrally formed in the radiating plate 5. Such a design provides a superior mechanical strength so that when vacuating the radiating channels 51, the radiating plate 5 will not distort and thus the radiating plate 5 may remain complete contact with an object to be cooled. Moreover, the fabrication process is simplified due to that the vacuating step and the working fluid filling process are efficient and time-saving.

Figure 6:
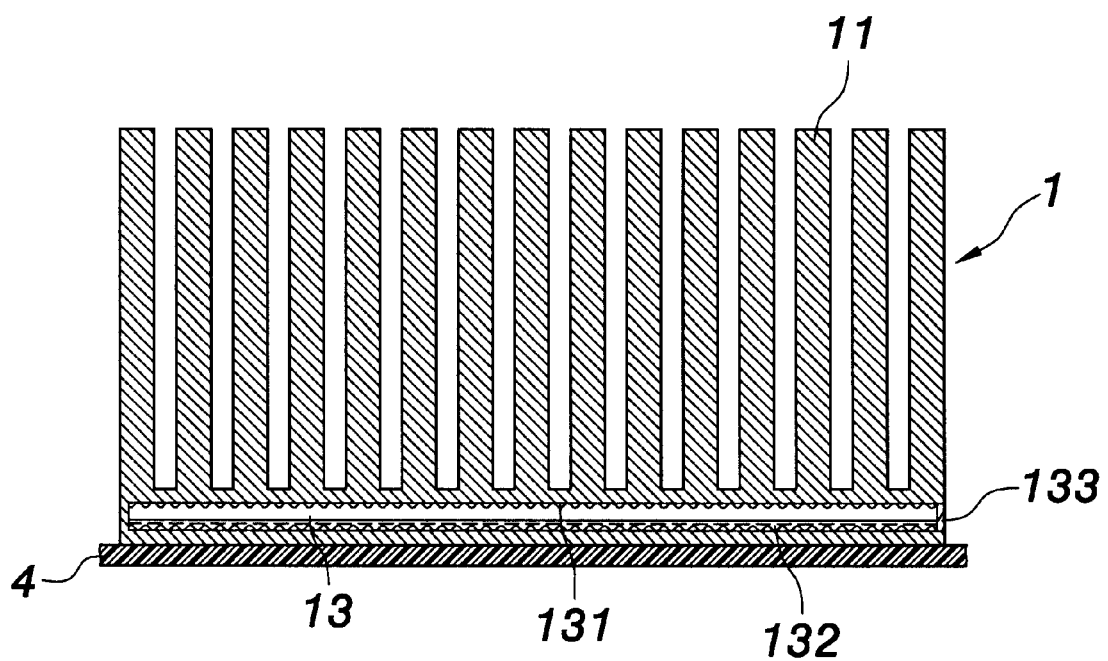
FIG. 6 is another preferred embodiment of this invention.

The means or steps described above should not used to limit this invention. Other similar steps or means are also suitable for this invention. For example, the connected radiating channels 51 formed by means of a tunneling means may be arranged in an orthogonal grid manner (shown in FIG. 4), a radial manner, or the like. The working fluid may be water, ammonia, pure water, alcohol, acetone, cooling medium, or the like. The radiating plate 5 may be made of copper, aluminum, or other materials with high heat conductivity. In addition, the radiator 1 may include an upper portion having a plurality of radiating fins 11 (as shown in FIG. 6) and a bottom portion for forming a matrix of radiating channels 51. The cross section of the radiating channels 51 (as shown in FIG. 5) may be circular, elliptic, triangular, rectangular, spiral, polygonal, or conoid. In another embodiment of the invention, a capillary structure forming step may be implemented after step 2 and before step 3. The capillary structure forming step is used to provide a capillary structure 52 on interior surface of the radiating channels 51. The capillary structure 52 may be metallic spring type, groove type, pillar type, net type, or porous type by metal powder sintering.

Referring to FIG. 6 with respect to FIG. 4 and FIG. 5. As mentioned, a radiator 1 may substitute for the radiating plate 5 shown in FIG. 5. The radiator 1 has an upper portion with a plurality of radiating fins 11 and a bottom portion in which a plurality of connected radiating channels 13 arranged in a matrix manner are created. The upper portion and the bottom portion are monolithically made by method known in the art. Working fluid 132 partially fills each of the radiating channels 13 and capillary structure 131 is formed on interior surface of the radiating channels 13. A schematic cross section of an exemplary sealed opening is indicated by reference numeral 133.

Figure 1:
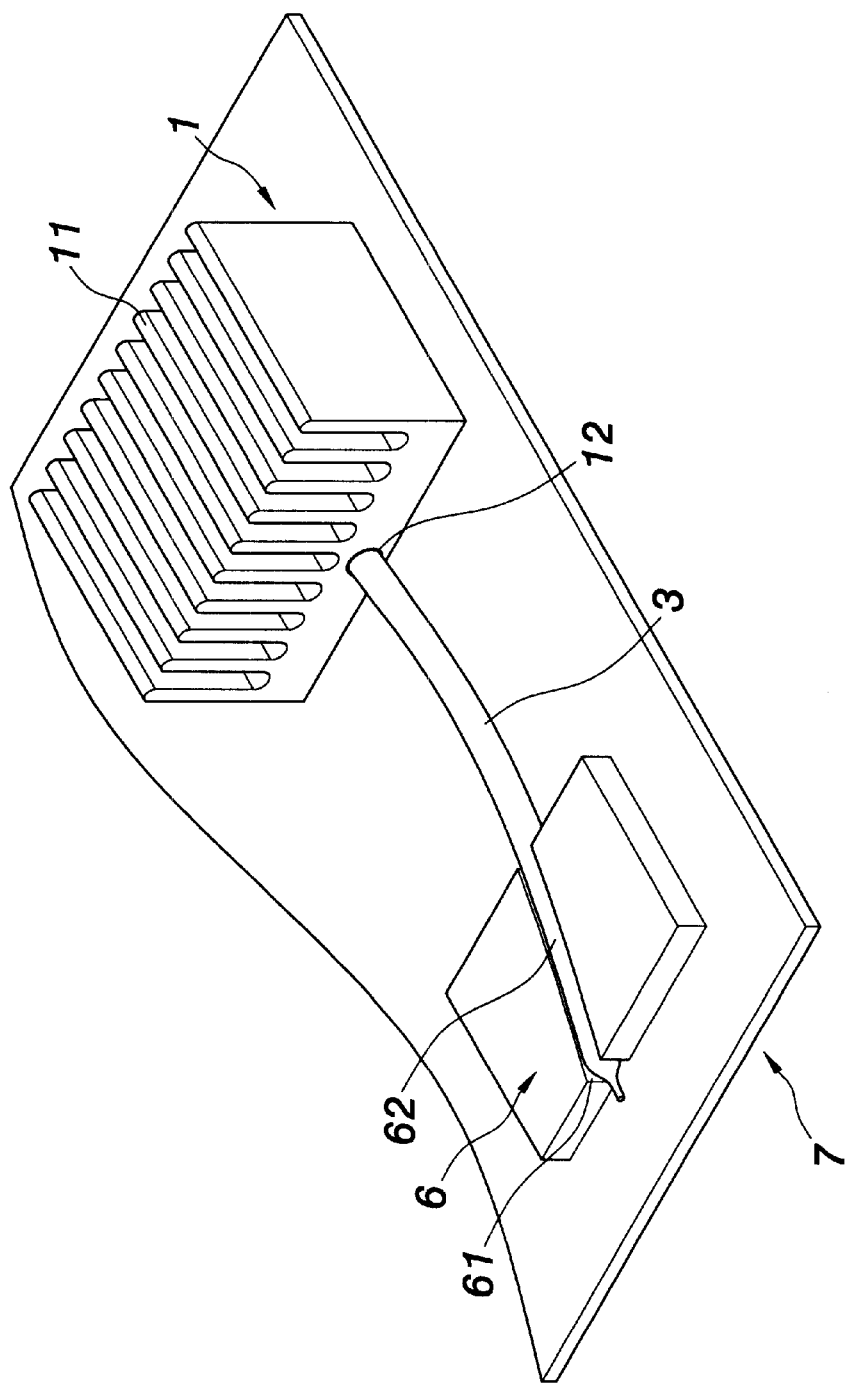
FIG. 1 shows a perspective view of a typical heat transfer device with a heat pipe.
Figure 1A:
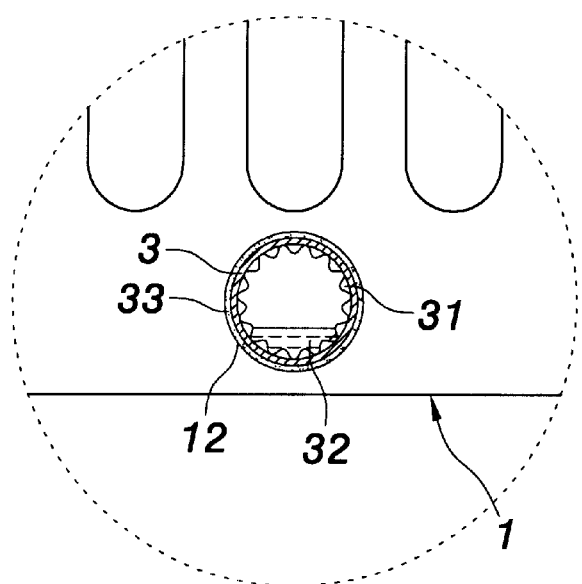
FIG. 1A is a cross sectional view of heat pipe of FIG. 1.
Figure 2:
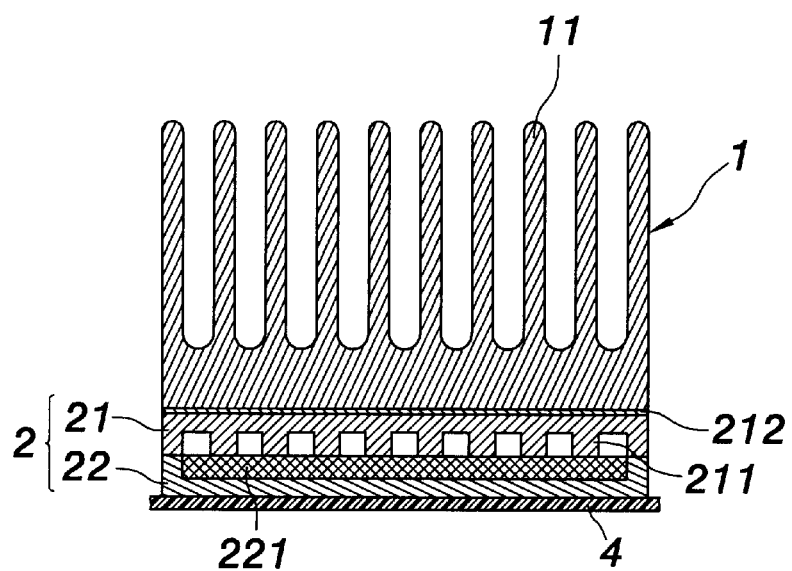
FIG. 2 is a cross sectional view showing another prior heat transfer device utilizing a plate-type container.
Figure 7:
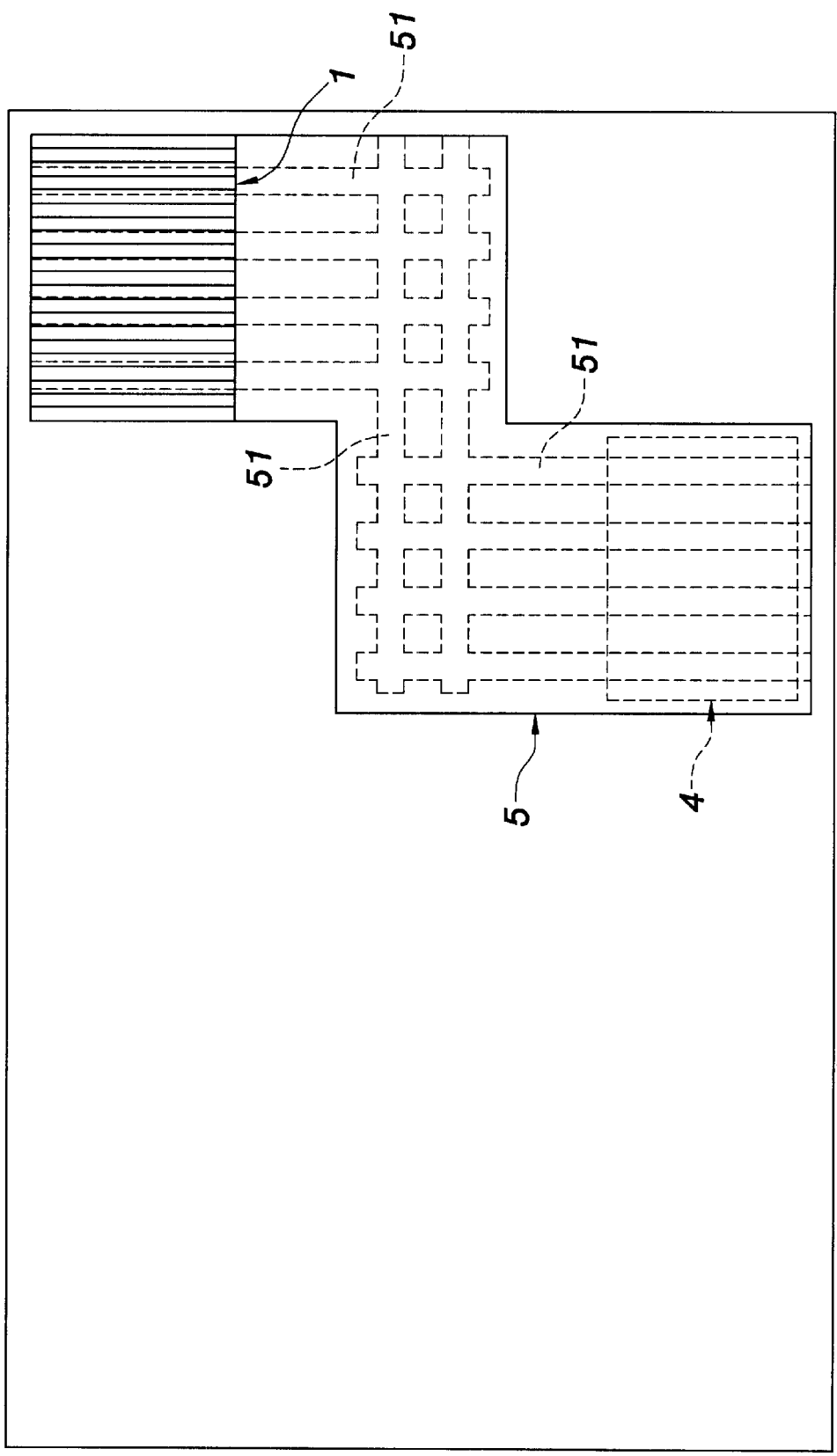
FIG. 7 is a top view of another preferred embodiment of this invention.

Referring to FIG. 7 of a top view according to another preferred embodiment of this invention. Here, the structure is similar to the prior art heat transfer device as depicted in FIG. 1, but has improved heat transfer efficiency and other disadvantages. As shown in FIG. 7, . In most circumstances, the object 4 to be cooled and the radiator 1 that is typically located near a cooling fan (not shown) are not aligned. In this case, a radiating plate 5 is designed to adapt the space orientation. The radiating channels 51 are only crossed to each other in the radiating plate 5. That is, the matrix of the radiating channels 51 is formed in a predetermined area in the radiating plate 5, and in other area of the radiating plate 5 the radiating channels 51 are not crossed. Of course, the working fluid, capillary structure, and the sealed openings are also provided but not shown in FIG. 7. Likewise, the radiating channels 51 are vacated. The structure disclosed in FIG. 7 possesses all the properties as the monolithic structures disclosed in FIG. 4 and FIG. 5. In use, the radiating plate 5 is attached to an aluminum pad 7 and the radiator 1 is attached to one end of the radiating plate 5. The object 4 to be cooled is placed in contact with a surface of the aluminum pad 7 corresponding to the other end of the radiating plate 5.

The structure in FIG. 7 according to the present invention has the following advantages when comparing with the above-mentioned conventional heat transfer device in FIG. 1.

1. Each of the radiating channels 51 may remain linear, and the capillary structure formed in interior surface of the radiating channels 51 will not be damaged.
2. Heat transfer is completed through one medium, i.e., the radiating plate 5.
3. No thermal grease or solder paste is required between the radiating channels 51 and the radiating plate 5. Heat resistance caused by gaps, rifts or solder paste is now minimized.
4. The radiating plate 5 has superior mechanical strength, since the radiating channels 51 are formed integrally with the radiating plate 5. Distortion caused by vacuating is thus eliminated and complete contact with the object to be cooled can be achieved.
5. Capillary structure will not be damaged during evacuating or when suffering from an outer stress.
6. In the embodiment with radiating fins (as shown in FIG. 6) are provided, the mechanical strength is enough for resisting collision. Cracks observed on the heat pipes of prior art heat transfer device are avoided. In case a crack formed on the radiating channels that lead to malfunction of working fluid, the radiating plate 5 still can work very well.
7. A most efficient matrix arrangement of radiating channels can be achieved.
8. Gaps formed between heat pipe 3 and adapting slot 12 in the prior art is eliminated.
9. The radiating channels serving as prior art heat pipe are simple and efficient. The arrangements of the radiating channels are diverse.
10. According to the method of this invention, various configuration of heat transfer device may be made for different heat dissipating modules or systems. The method of this invention is cost-effective and has high yield.

In short, it is advantageous to use the structure and its fabrication method of the present invention because the heat transfer efficiency is improved. Moreover, the mechanical strength of the heat transfer device of this invention is enhanced.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A method for fabricating a heat pipe structure in a radiating plate, the method comprising:
   implementing a tunneling means to form a plurality of radiating channels in said radiating plate, each of said plurality of radiating channels has only one opening;
   leaving only one of the openings of the radiating channels unsealed, while sealing the other openings of said radiating channels;
   filling working fluid into said radiating channels via said unsealed opening; and
   evacuating said radiating channels and sealing said unsealed opening.
2. The method of claim 1 wherein said plurality of radiating channels may be arranged in a matrix manner or radial manner and the radiating channels connect to each other.
3. The method of claim 1 wherein said working fluid is selected from a group consisting of water, ammonia, pure water, alcohol, acetone, and cooling medium.
4. The method of claim 1 further comprising a capillary structure forming step before sealing said openings.
5. The method of claim 4 wherein said capillary structure may be metallic spring type, groove type, pillar type, net type, or porous type by metal powder sintering.
6. The method of claim 1 wherein said radiating plate is made of copper, or aluminum.
7. The method of claim 1 wherein cross section of said radiating channels may be circular, elliptic, triangular, rectangular, spiral, polygonal, or conoid.
8. The method of claim 1 wherein sealing of said openings may be completed by means of soldering process or a diffusion welding technique.
9. The method of claim 1 wherein said radiating plate may be a simple plate or with integral radiating fins.
10. A method for fabricating a heat pipe structure in a radiating plate, the method comprising:
    providing a plate-type radiator having a shape and size according to desired purposes;
    implementing a tunneling means to tunnel said radiator so as to form a plurality of radiating channels;
    leaving only one of said openings of said radiating channels unsealed, while sealing the other openings of said radiating channels;
    injecting working fluid into said radiating channels via said unsealed opening and evacuating the radiating channels then sealing said unsealed opening.
11. The method of claim 10 further comprising a capillary structure forming step after forming the radiating channels and before sealing said openings.

* * * * *